United States Patent [19]

Kobayashi et al.

[11] Patent Number: 4,505,028

[45] Date of Patent: Mar. 19, 1985

[54] METHOD OF PRODUCING SEMICONDUCTOR DEVICE

[75] Inventors: Nobuyoshi Kobayashi, Hachioji; Seiichi Iwata, Sayama; Naoki Yamamoto, Kawaguchi; Hitoshi Matsuo, Kokubunji; Teiichi Homma, Koutou, all of Japan

[73] Assignee: Hitachi, Ltd., Tokyo, Japan

[21] Appl. No.: 571,946

[22] Filed: Jan. 19, 1984

[30] Foreign Application Priority Data

Jan. 19, 1983 [JP] Japan .................. 58-6868

[51] Int. Cl.³ .................. H01L 21/44; H01L 29/40
[52] U.S. Cl. .................. 29/578; 29/571; 29/591; 148/1.5; 148/187; 357/67; 357/23.9
[58] Field of Search .................. 29/571, 578, 576 R, 29/589, 591; 148/187, 1.5; 357/23, 40, 45, 65, 67

[56] References Cited

U.S. PATENT DOCUMENTS

| | | | |
|---|---|---|---|
| 3,679,492 | 7/1972 | Fang et al. | 29/571 X |
| 3,752,711 | 8/1973 | Kooi et al. | 29/571 X |
| 3,959,025 | 5/1976 | Polinsky | 148/187 X |
| 4,093,503 | 6/1978 | Harris et al. | 148/187 X |
| 4,410,801 | 10/1983 | Sakurai et al. | 250/398 X |

*Primary Examiner*—Brian E. Hearn
*Assistant Examiner*—David A. Hey
*Attorney, Agent, or Firm*—Antonelli, Terry & Wands

[57] ABSTRACT

A silicon wafer having a tungsten and/or molybdenum film formed on its surface is heat-treated in hydrogen containing water vapor. Thus, silicon can be selectively oxidized without substantially oxidizing tungsten and/or molybdenum.

33 Claims, 21 Drawing Figures

METHOD OF PRODUCING SEMICONDUCTOR DEVICE

BACKGROUND OF THE INVENTION

This invention relates generally to a method of producing a semiconductor device and, more particularly, to a method for producing a semiconductor device equipped with electrodes and interconnections consisting of tungsten, molybdenum or their silicides.

As is well known in the art, polycrystalline silicon has been used widely as a material for electrodes and interconnections of a conventional semiconductor device.

Polycrystalline silicon has been used for the following reasons: In order to miniaturize an MIS (e.g., MOS) transistor, it is inevitable to employ so-called "self-alignment" techniques which form source and drain by ion implantation using the gate electrode as the mask. After ion-implantation is completed, however, annealing at high temperatures must be made to remove distortion of the source and drain region that has developed due to the ion-implantation.

Accordingly, to produce a miniature MOS transistor by self-alignment, the gate electrode must be made of a material which can withstand the heat-treatment at high temperatures, and polycrystalline silicon having a high melting point has replaced aluminum that was used widely and previously.

The disadvantage of this polycrystalline silicon is, however, that its electric resistance is greater than metals. Since higher integration and miniaturization of semiconductor devices has made a rapid process in recent years, the width of the electrode or interconnection becomes extremely small. Accordingly, if polycrystalline silicon is used, the resistance of the electrode or interconnection does not become sufficiently low and it is difficult to produce a miniature semiconductor device having high characteristics.

To solve this problem, the use of tungsten, molybdenum or their silicides has been proposed in place of polycrystalline silicon so as to form the electrode and the interconnection. Since tungsten, molybdenum or their silicides have a high melting point, they can withstand annealing at high temperatures and, moreover, since their electric resistance is by far lower than that of polycrystalline silicon, the problem described above that occurs when polycrystalline silicon is used does not develop even when the width of the electrode or interconnection is extremely small.

However, tungsten and molybdenum have the problem than they are more easily oxidized than silicon. When heat-treatment is carried out at about 300° C. or above in an oxidizing atmosphere, therefore, they are rapidly oxidized, disloged or peel off from the substrate.

An insulating film (e.g., SiO2 film) deposited on a semiconductor substrate is demaged or contaminated if an insulating film becomes thin or ion-implantation is effected using the gate as the mask to form the source and drain during the fabrication of an MOS transistor. Accordingly, the damaged or contaminated insulating film must be removed by etching after completion of gate formation and ion-implantation, and heat-treatment is carried out in an oxidizing atmosphere to regrow an $SiO_2$ film on the semiconductor substrate. This process is carried out generally and widely and is an indispensable step to form a high reliability MOS transistor. (This process or treatment will hereinafter be referred to as "light oxidation".)

When polycrystalline silicon is used as the gate electrode and the interconnection, light oxidation described above can be carried out smoothly without any problem, but since tungsten and molybdenum are extremely oxidizable as described earlier, the gate electrode and the interconnection are extremely easily oxidized when tungsten or molybdenum is used as the material, so that the semiconductor devices having high reliability and high integration density cannot be produced.

SUMMARY OF THE INVENTION

To eliminate the problems described above, the present invention is directed to providing a method of producing a semiconductor device by which one can form the semiconductor device having electrodes and interconnection consisting of tungsten, molybdenum or their silicides without any problem.

It is another object of the present invention to provide a method of producing a semiconductor device by which one can selectively oxidize silicon alone without substantially oxidizing tungsten, molybdenum or their silicides.

It is a further object of the present invention to provide a method of forming electrodes and interconnections of tungsten, molybdenum or their silicides for use in production of, e.g., semiconductor devices, on a semiconductor substrate of, e.g., silicon, using insulating layers of, e.g., silicon oxide. Other materials for the semiconductor substrate include compound semiconductor materials, such as GaAs.

To accomplish the objects described above, the present invention selectively oxidizes, e.g., silicon alone without substantially oxidizing tungsten, molybdenum or their silicides by carrying out heat-treatment in a mixed atmosphere of hydrogen and vapor (e.g., water vapor).

DESCRIPTION OF THE PREFERRED EMBODIMENTS

As is well known, Si and most metals form their oxides upon reacting with vapor (e.g., water vapor).

According to the examination carried out by the inventors of the present invention, however, it has been found that only Si is selectively oxidized, without the oxidation of W and/or Mo, by heating Si and W and/or Mo in a mixed atmosphere consisting of the vapor and hydrogen.

Though the mechanism of this reaction has not been clarified fully, it is considered that even if W and Mo are oxidized by the vapor to the oxides, the resulting oxides are immediately reduced to the metallic state by the coexisting hydrogen, whereas Si is not reduced by hydrogen but remains as-oxidized by the vapor.

It has also been found out that the selective reduction of W and Mo is significantly affected by the partial pressure ratio $P_{H_2O}/P_{H_2}$ (which will be hereinafter represented by R).

Figure 1:
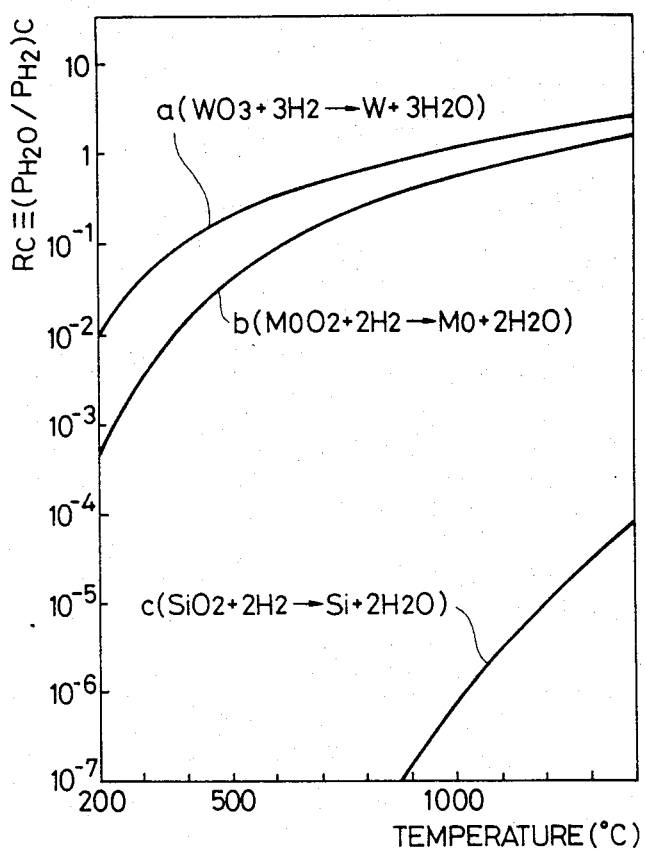
FIG. 1 is a diagram showing the preferred ranges of vapor-hydrogen partial pressure ratio and heating temperature.
Figure 2:
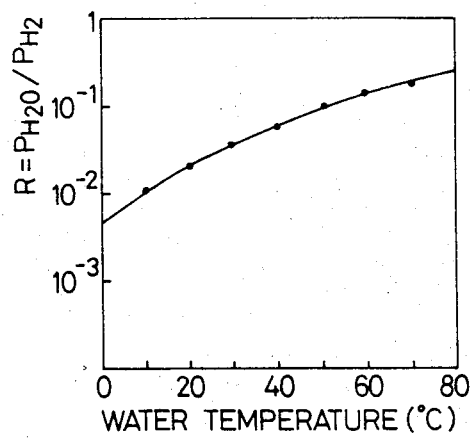
FIG. 2 is a diagram showing the relation between the water temperature of a bubbler and the partial pressure ratio in the resulting hydrogen.

In other words, the relation represented by curves a, b and c in FIG. 1 has been found existing between the partial pressure ratio $R_c$, when the reduction of W, Mo and Si oxides starts, and various temperatures.

As can be seen clearly from FIG. 1, all of W, Mo and Si oxides are reduced in the region below the curve c representing the reduction of $SiO_2$, but if the heat-treatment is carried out inside the region between the curve representing the reduction of $WO_3$ and the curve c described above, only Si is selectively oxidized, without substantially oxidizing W.

Similarly, only Si is oxidized selectively, without substantially oxidizing W and Mo, if the heat-treatment is carried out in the region interposed between the curve b representing the reduction of $MoO_2$ and the curve c described above.

When the heat-treating temperature is 1,000° C., for example, only Si is selectively oxidized without oxidizing W and Mo (with the oxides being reduced), if R is in the range of from $10^{-6}$ to less than 1. As other examples, and as can be seen from FIG. 1, when the heat-treating temperature is 400° C., only Si is selectively oxidized without substantially oxidizing W and Mo when R is in the range of from $10^{-7}$ to $10^{-1}$; moreover, when the heat-treating temperature is 1200° C., only Si is selectivly oxidized without substantially oxidizing W and Mo when R is in the range of from, e.g., $5 \times 10^{-5}$ to 1.5.

The following Table provides a summary, as seen from FIG. 1, of respective heat-treatment temperatures and values of R:

TABLE 1

| Heat-Treatment Temperature (°C.) | R values Curve c | Curve b | Curve a |
|---|---|---|---|
| 400 | $10^{-7}$ | $2 \times 10^{-2}$ | $10^{-1}$ |
| 500 | $10^{-7}$ | $5 \times 10^{-2}$ | $2 \times 10^{-1}$ |
| 600 | $10^{-7}$ | $7 \times 10^{-2}$ | $3 \times 10^{-1}$ |
| 700 | $10^{-7}$ | $2 \times 10^{-1}$ | $5 \times 10^{-1}$ |
| 800 | $10^{-7}$ | $4 \times 10^{-1}$ | $7 \times 10^{-1}$ |
| 900 | $8 \times 10^{-7}$ | $6 \times 10^{-1}$ | $8 \times 10^{-1}$ |
| 1000 | $10^{-6}$ | $7 \times 10^{-1}$ | 1 |
| 1100 | $5 \times 10^{-6}$ | $9 \times 10^{-1}$ | 1.5 |
| 1200 | $7 \times 10^{-6}$ | 1 | 2.0 |

If the present invention is applied to the "light oxidation" when fabricating MOS transistors, for example, the $SiO_2$ film can be formed on the Si substrate without oxidizing the electrodes and interconnections made of W, Mo or their silicides, and the present invention is extremely advantageous for the fabrication of the MOS transistors having high integration density.

If the heat-treating temperature is below about 400° C., however, the oxidation speed of Si becomes extremely slow and when it is above about 1,200° C., on the other hand, deformation of the diffusion region formed in the substrate becomes so remarkable and damage of the reaction tube also becomes great. For these reasons, the heat-treating temperature is selected in the range of from about 400° to about 1,200° C.

EXAMPLE 1

After an $SiO_2$ film was formed on a silicon wafer by a known thermal oxidation process, a 0.3 μm-thick W or Mo film was formed by sputtering on the $SiO_2$ film and was then heat-treated at 1,000° C. for 30 minutes in an $N_2$ or Ar atmosphere containing 1 ppm of oxygen as an impurity.

According to the procedures described above, the W and Mo films were not mostly oxidized but there were also the cases in which only the film edge portions were oxidized, so that a stable result could not be obtained. Incidentally, the Si surface was oxidized in all cases.

Next, the sample described above was heated at 1,000° C. for 30 minutes in the hydrogen-vapor atmosphere in which the partial pressure ratio R of vapor to hydrogen was changed stepwise from 1, $2 \times 10^{-1}$, $3 \times 10^{-2}$, ..., $1 \times 10^{-6}$ so as to examine the state of oxidation of W, Mo and Si. As a result, oxidation of W and Mo was observed when R was 1, but could not be observed when R was below $3 \times 10^{-1}$. On the other hand, Si was oxidized in all cases. Here, the state of oxidation was examined by X-ray photoelectronic spectrometry.

TABLE 2

| Vapor Material | $H_2/H_2O$ R (partial pressure ratio of $H_2/H_2O$) | | | | | $N_2$ $O_2 \cdot 1$ ppm | $A_r$ |
|---|---|---|---|---|---|---|---|
| | 1 | $3 \times 10^{-1}$ | $3 \times 10^{-2}$ | $1 \times 10^4$ | $10 \times 10^6$ | | |
| Si | X | X | X | X | X | X | X |
| W | X | O | O | O | O | X | X |
| Mo | X | — | O | — | O | X | X |

Remarks:
X oxidized
O non-oxidized

EXAMPLE 2

This example illustrates the relation between the oxidation of Si and the partial pressure ratio R ($P_{H_2O}/P_{H_2}$) of $H_2O$ and $H_2$ in the atmosphere when heating is effected in the $H_2/H_2O$ atmosphere.

The vapor-contining hydrogen could be obtained by passing hydrogen through a bubbler containing pure water, and the vapor quantity in hydrogen could be adjusted to a desired value by changing the temperature of the pure water in the bubbler.

Thus, heat-treatment was carried out at 950° C. for 10 minutes by changing the ratio R ($P_{H_2O}/P_{H_2}$) and the thickness of the $SiO_2$ film formed on the silicon wafer was measured using an ellipsometer.

Figure 3:
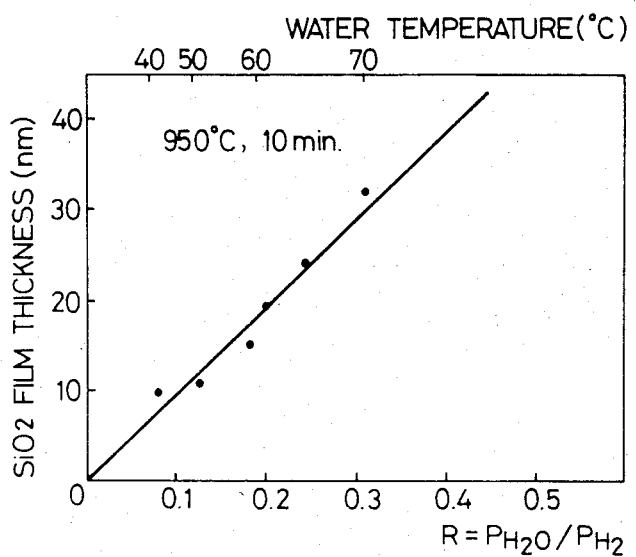
FIG. 3 is a diagram showing the relation between the partial pressure ratio in hydrogen and the thickness of the resulting $SiO_2$ film.
Figure 4:
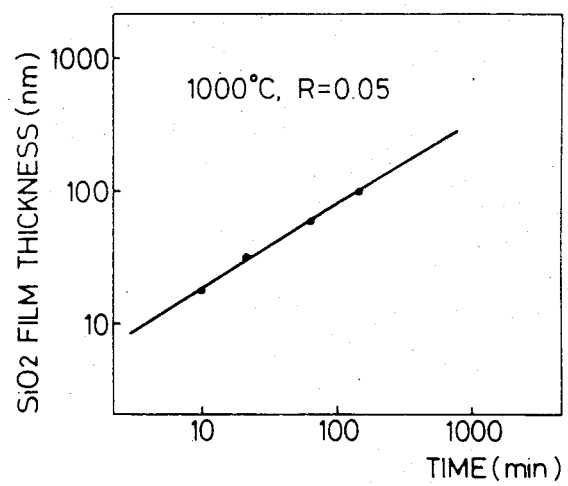
FIGS. 4 and 5 are diagrams showing the relation between the thickness of the resulting $SiO_2$ film and the heating time and between the thickness of the $SiO_2$ film and the heating temperature, respectively.
Figure 5:
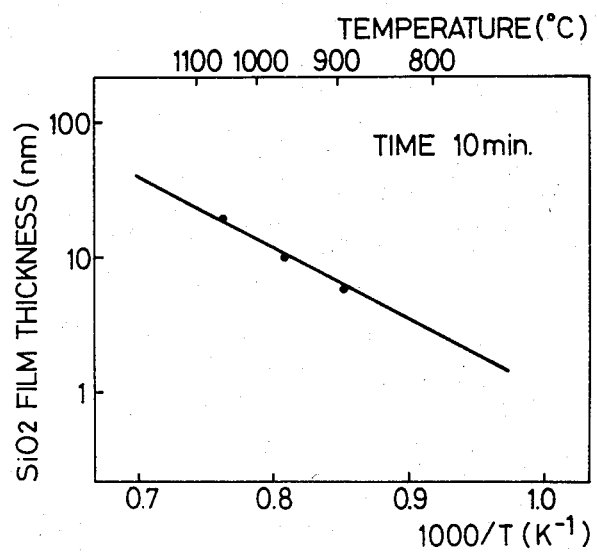

The silicon wafer used for the measurement was washed by hydrofluoric acid before heating to remove in advance the oxide film on the wafer surface. The result obtained was shown in FIG. 3. The thickness of the $SiO_2$ film increased substantially proportionally to the value R within the range of $0 < R \leq 0.4$. FIG. 4 shows the result of the measurement of time dependence of the thickness of the $SiO_2$ film when the heating temperature was 1,000° C. and R was 0.05. Similarly, FIG. 5 shows the dependence of the thickness of the $SiO_2$ film upon the heating temperature when R was 0.05.

EXAMPLE 3

This example illustrates the application of the present invention to the fabrication of an MOS field effect transistor.

Figure 6A:
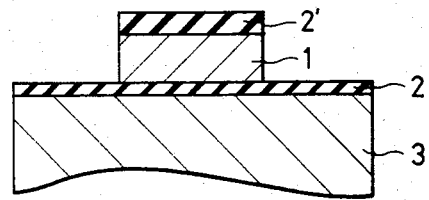
Figure 6B:
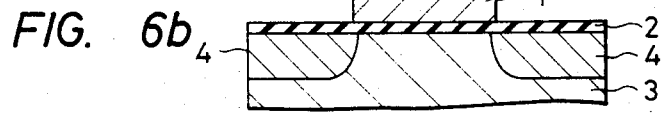
Figure 6C:
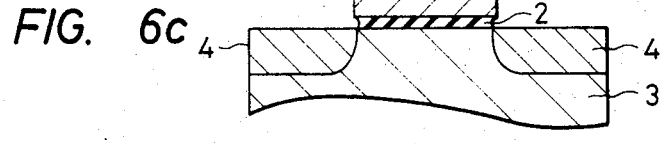

First, as shown in FIG. 6a, a tungsten film 1 (formed by sputtering) and a silicon dioxide film 2' (formed by chemical vapor deposition (CVD)) were formed sequentially in thicknesses of 350 nm and 60 nm, respectively, on a 20 nm-thick silicon dioxide film 2 that was formed on the surface of a single crystal silicon substrate 3 of one conductivity type. The tungsten film and silicon dioxide film could also be formed by other film-forming procedures, such as CVD and sputtering, respectively. The thicknesses of the silicon dioxide film 2, the tungsten film 1 and the silicon dioxide film 2' can be 5–100 nm, 30–1000 nm and 10–500 nm, respectively. The silicon dioxide film 2' and the tungsten film 1 were then patterned sequentially into the pattern of a gate electrode by known dry etching techniques. Next, an impurity ion of an opposite conductivity type to that of the substrate was implanted into the silicon substrate 3 through the silicon dioxide film 2 using the electrode consisting of the silicon dioxide film 2' and the tungsten film 1 as the mask, to form a source and drain 4 as shown in FIG. 6b. Any conventional impurity ion can be utilized. The silicon oxide films 2, 2' at the portions other than the portion covered with the W film 1 were selectively removed using a hydrofluoric acid solution diluted to 1/10 by water (that is, 0.1 HF, 0.9 $H_2O$), as shown in FIG. 6c.

Figure 6D:
Figure 6E:
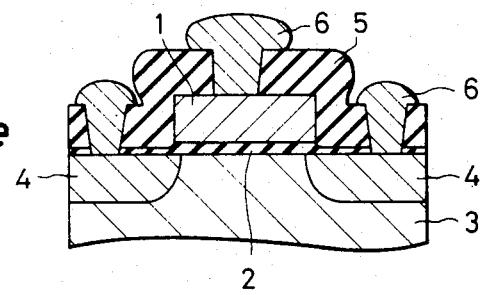

Next the heat-treatment was effected at 900° C. for 15 minutes in hydrogen containing 5% of water vapor to grow an about 10 nm-thick silicon dioxide film 2" on the exposed silicon substrate 3 as shown in FIG. 6d. Thereafter, a phosphosilicate glass layer 5 was deposited in a thickness of about 500 nm over the entire surface and contact holes where bored by photoetching. Aluminum interconnections 6 were formed to complete the MOS transistor as shown in FIG. 6e.

This example corresponds to the light oxidation step in the silicon gate process, and the tungsten gate transistor produced by this step exhibited the improvement in the MOS characteristics (breakdown voltage of the $SiO_2$ film and variance of breakdown voltage).

EXAMPLE 4

Figure 7A:
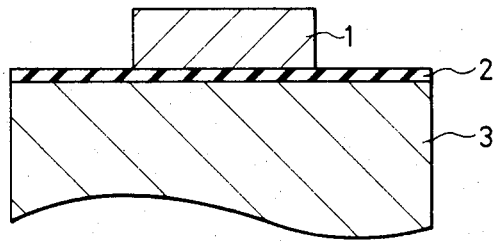
FIGS. 6a through 6e, 7a, 7b, 8a, 8b, 9a, 9b, 10a, 10b, 10c, 11a and 11b are process diagrams showing other embodiments of the present invention, respectively.
Figure 7B:
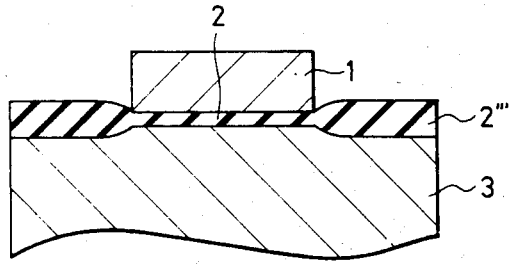

A 350 nm thick tungsten film 1 was deposited (by sputtering) and patterned, by conventional techniques, on a 20 nm-thick $SiO_2$ film 2 that was formed on an Si single crystal substrate as shown in FIG. 7a. Heat-treatment was effected at 1,000° C. for one hour in hydrogen passed through a bubbler of pure water (containing about 3% of water), whereby the thickness $d_1$ of the $SiO_2$ film 2 of the portion covered with the tungsten film 1 and the thickness $d_2$ at the portion not covered with the tungsten film 1 increased to 30 nm and 70 nm, respectively. However, the tungsten film 1 was not oxidized. The moisture content in hydrogen, heating temperature and heating time were increased (or decreased) in accordance with Example 2 and the thickness $d_1$ and $d_2$ of the $SiO_2$ film increased (or decreased) in response to the former. After the heat-treatment, the breakdown voltage of the $SiO_2$ film was measured using the tungsten film as the electrode. The breakdown voltage was found increased as compared with that before the heat-treatment. It was thus confirmed that the present invention could effectively prevent the degradation of the characteristics of the $SiO_2$ film due to the heat-treatment.

EXAMPLE 5

Figure 8A:
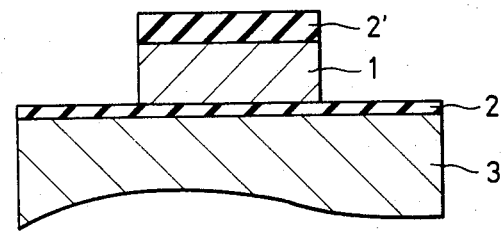
Figure 8B:
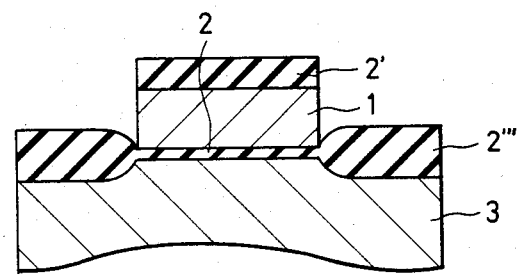

A 300 nm-thick tungsten film 1 was deposited on a 20 nm-thick $SiO_2$ film 2 that was formed on an Si single crystal substrate 3 as shown in FIG. 8a, and an 80 nm-thick $SiO_2$ film 2' was deposited by CVD on the tungsten film 1. Such $SiO_2$ film 2' can have a thickness of 10–500 nm. Such film 2' can also be formed of other insulating materials, such as silicon nitride ($Si_3N_4$). Unnecessary portions were removed by sequentially etching the $SiO_2$ film 2' and the tungsten film 1. The sample was then heated at 900° to 1,000° C. for 15 minutes in hydrogen containing 3 to 20% of water, whereby the portion of the $SiO_2$ film 2'" not covered with the tungsten film 1 became thicker in the same way as in Example 4, but the thickness of the $SiO_2$ film 2 below the tungsten film 1 remained substantially unaltered, as shown in FIG. 8b. As can be understood from this Example, when those materials (at least one of polycrystalline Si, PSG, $SiO_2$, $Si_3N_4$ and the like), which are generally used as a mask for the diffusion of an impurity, are used for the heat-treatment on the tungsten film, the function of the mask for the prevention of oxidation can be more improved than when heat-treatment is carried out using the tungsten film alone.

EXAMPLE 6

Figure 9A:
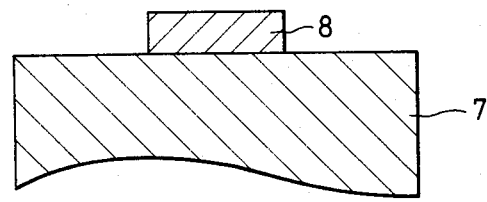
Figure 9B:
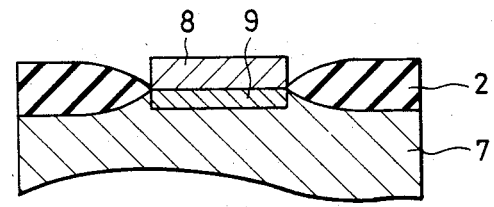

A 350 nm-thick molybdenum film 8 (formed by sputtering) was deposited on a polycrystalline silicon substrate 7 as shown in FIG. 9a. Other methods which could be used for forming the Mo film include CVD and electron beam evaporation. Unnecessary portions of the Mo film were removed by etching the film 8. The sample was heat-treated at 900° C. for 30 minutes in hydrogen containing 5% of water vapor. As a result, the molybdenum film 8 reacted with the polycrystalline silicon substrate 7 and a molybdenum silicide layer 9 was formed at their contact portion. On the other hand, the portion of the surface of the polycrystalline silicon substrate 7 at which the molybdenum film 8 did not exist and which was exposed was oxidized to form a thick $SiO_2$ film 2. According to this method, contact could be established between the molybdenum film and the polycrystalline silicon substrate and, at the same time, an insulating film could be formed on the polycrystalline silicon in self-alignment with the molybdenum electrode. Substantially the same result could be obtained by use of a tungsten film in place of the molybdenum film.

EXAMPLE 7

Figure 10A:
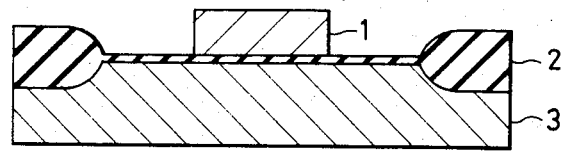
Figure 10B:
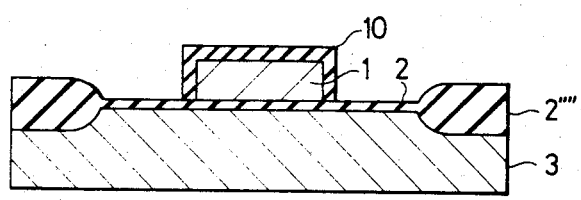
Figure 10C:
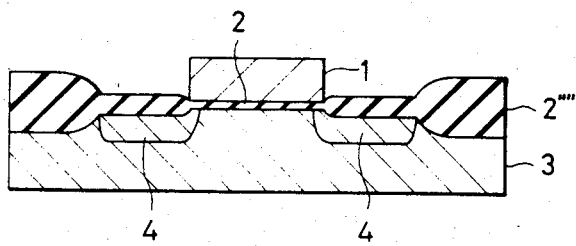

FIGS. 10a through 10c illustrate another method of producing an MOS field effect semiconduction device to which the present invention is applied.

First, as shown in FIG. 10a, an about 350 nm-thick tungsten film (formed by sputtering) was formed on a 20 nm thick field insulating film ($SiO_2$ film) 2 (reference numberal 2'" represents a field silicon dioxide film formed in advance) that was formed on the surface of an Si crystal substrate 3. The tungsten film was then patterned to form a gate electrode 1. Next, the sample was heated in an oxygen atmosphere of about 400° C. to form an about 50 nm thick tungsten oxide film 10 on the surface of the tungsten film 1 as shown in FIG. 10b. Using the tungsten oxide film 10 and the tungsten film 1 as the mask, an impurity was doped to the surface region of the Si substrate 3 and the sample was heat-treated at 950° C. for 30 minutes in hydrogen containing 5% of water vapor, thereby forming source and drain region 4. In this process, the tungsten oxide film 1 served as the mask for doping the impurity by ion implantation or the like, and was reduced to tungsten due to the subsequent heat-treatment in the $H_2O$-$H_2$ atmosphere, as shown in FIG. 10c. Due to the heat-treatment described above, the silicon oxide film on the source-drain region 4 became thicker than the oxide film below the gate electrode.

EXAMPLE 8

Figure 11A:
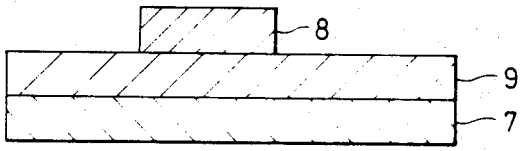
Figure 11B:
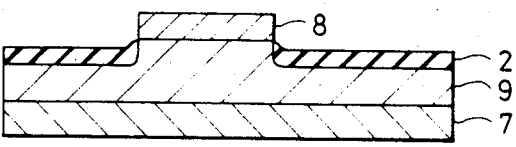

An about 250 nm thick molybdenum silicide film 9 was formed on the surface of a 300 nm thick polycrystalline silicon plate 7 as shown in FIG. 11a and a molybdenum film 8 was vacuum deposited on it in a thickness of about 300 nm. The molybdenum silicide film can be formed by conventional techniques, such as co-sputtering both Mo target and Si target; sputtering using Mo-Si target; and CVD. Unnecessary portions of the molybdenum film were removed by etching to form an electrode 8. The sample was heated at 900° C. for 10 minutes in hydrogen containing 5 % of water, whereby a part of the molybdenum electrode 8 was converted to its silicide, and an $SiO_2$ film 2 was formed on the exposed surface of the resulting molybdenum silicide film 9. The reason was assumed to be the fact that the portion below the molybdenum electrode was converted to the silicide due to the supply of Si from the polycrystalline silicon film 7 as the base to the molybdenum silicide film 9 and the $SiO_2$ film could be formed at the exposed portion of the molybdenum silicide film. As can be understood clearly from this example, the present invention makes it possible to grow the $SiO_2$ film, not only on Si, but also on the silicide film.

When tungsten silicide was used in place of molybdenum silicide, the exposed surface of tungsten silicide could also be oxidized to form $SiO_2$ without oxidizing molybdenum and tungsten. Also, the tungsten silicide can be formed utilizing techniques corresponding to those used in forming the molybdenum silicide.

The same result could be obtained when silicides of molybdenum and tungsten were formed on single crystal silicon in place of polycrystalline silicon.

EXAMPLE 9

Next, still another method of producing an MOS field effect semiconductor device in accordance with the present invention will be described with reference to FIG. 6, described in Example 3.

A 350 nm thick tungsten film 1 was deposited on a 20 nm-thick gate $SiO_2$ film 2 that was formed on an Si single crystal substrate 3. When etching the sample to a gate electrode pattern, there had been conventionally the problem that the $SiO_2$ film around the gate electrode was also damaged so that the $SiO_2$ film became thinner by about 10 nm and the breakdown voltage of the gate $SiO_2$ film deteriorated. When the sample was heated at 900° C. for 10 minutes in hydrogen containing 3% of water after etching the gate electrode of tungsten in accordance with the present invetion, however, the damage of the $SiO_2$ film was removed and, at the same time, a fresh $SiO_2$ film grew. Accordingly, the breakdown voltage of the gate $SiO_2$ film was improved. This heat-treatment may be effected after etching and removing the $SiO_2$ film around the gate, and the same result could be obtained when the heat-treatment was effected without removing the $SiO_2$ film.

EXAMPLE 10

The following two kinds of wafers were prepared: first, an Si wafer having a tungsten film formed on the surface thereof was heated in an oxygen atmosphere to form a 300 nm thick tungsten oxide film. Separately, an Si wafer was washed by hydrofluoric acid to prepare a wafer (up to 2 nm thick) hardly having any oxide film. These two kinds of wafers were heated at 1,000° C. for 1 hour in hydrogen containing 3% of water and their surfaces were analyzed by X-ray photoelectron spectrometry. As a result, the tungsten oxide was reduced to tunsten due to the heat-treatment, but the Si wafers were oxidized and an $SiO_2$ film was formed on the surface. The resulting $SiO_2$ film was found to be 58 nm thick as a result of measurement by an ellipsometer.

As described above, silicon can be selectively oxidized without oxidizing tungsten and molybdenum during the fabrication of a semiconductor device by using $H_2O/H_2$ as the atmosphere of heat-treatment and by adjusting their partial pressure ratio. As a result, the so-called "light oxidation" process, that has been employed in the conventional polycrystalline silicon gate process, can also be used in the fabrication process of MOS transistors using tungsten or molybdenum for the gate. In other words, the present invention eliminates the problem of oxidation of tungsten and molybdenum during fabrication of semiconductor devices and a process approximate to the one used in the conventional polycrystalline silicon process can now be used. Moreover, the characteristics of the resulting device can be remarkably stabilized in comparison with the tungsten or molybdenum gate process not using the $H_2O/H_2$ heat-treatment.

EXAMPLE 11

In an Si gate process for fabricating an MOS transistor using a polycrystalline silicon film for a gate electrode, a so-called "glass flow" process is effected in which, after the Si gate is covered with a PSG (phosphosilicate glass) which is an inter-layer insulating film, the surface of the PSG film is made smooth. When Mo or W is used for the gate, however, the oxidation of Mo or W due to oxygen will occur when heated in oxygen or nitrogen, even if Mo or W is covered with the PSG film, because pin-holes exist in the PSG film. When the sample was heated at 1,000° C. for 30 minutes, for example, in an $H_2+H_2O$ (5% moisture content) atmoshpere in accordance with the present invention, however, the surface of the 500 nm thick PSG film (P concentration = 12 mol %) covering W was made sufficiently flat. Accordingly, the present invention made it possible to carry out "glass flow" without the possiblity of oxidation of W or Mo.

As described above, the present invention makes it possible to selectively oxidize only Si and to form an $SiO_2$ film without oxidizing W or Mo and to remarkably improve the reliability and producibility of semiconductor devices using these materials. Particularly when W or Mo is used as the low resistance electrode of an MOS field effect semiconductor device, compatability with the Si gate process can be improved. For instance, the "light oxidation" process becomes feasible. Since the present invention uses hydrogen, containing water, as the heating atmosphere, it can be easily practiced using an ordinary heating apparatus consisting of a silica tube and an electric furnace and is excellent in both mass-producibility and economy.

What is claimed is:

1. A method of forming at least one of electrodes and interconnections of at least one of tungsten or molybdenum on a semiconductor substrate, including the step of selectively oxidizing the exposed surface of said semiconductor substrate, without substantially oxidizing said at least one of tungsten and molybdenum on the substrate, by carrying out heat-treatment in a hydrogen atmosphere containing water vapor.

2. The method of claim 1 wherein said semiconductor substrate is made of silicon.

3. The method of claim 1, wherein the heat-treating temperature is from 400° C.–1200° C.

4. The method of claim 1, wherein the partial pressure ratio between said water vapor and said hydrogen gas in said heat-treatment and the heat-treating temperature are selected as the values falling in the range between the curve b and the curve c of FIG. 1.

5. The method of claim 1, wherein the at least one of electrodes and interconnectons are of tungsten, and the partial pressure ratio between said vapor and said hydrogen gas in said heat-treatment and the heat-treating temperature are selected as the values falling in the range between the curve a and the curve c of FIG. 1.

6. The method of claim 1, wherein the partial pressure ratio of the water vapor and hydrogen, and the heat-treatment temperature, are selected such that only the semiconductor substrate surface is oxidized, without oxidizing the at least one of tungsten and molybdenum.

7. A method of producing a semiconductor device including the step of selectively oxidizing silicon without substantially oxidizing at least one of tungsten and molybdenum by carrying out heat-treatment in a hydrogen atmosphere containing water vapor.

8. The method of producing a semiconductor device as defined in claim 7, wherein said silicon is single crystal silicon, polycrystalline silicon or silicon contained in tungsten or molybdenum silicides.

9. The method of producing a semiconductor device as claimed in claim 8, wherein the partial pressure ratio between said water vapor and said hydrogan gas in said heat-treatment and the heat-treating temperature are selected as the values falling in the range between the curve b and the curve c of FIG. 1.

10. The method of producing a semiconductor device as defined in claim 9, wherein the heat-treating temperature is from 400° C. to 1,200° C.

11. The method of producing a semiconductor device as in claim 7, wherein the heat treatment is carried out in the presence of tungsten, and wherein the partial pressure ratio between said water vapor and said hydrogen gas in said heat-treatment and the heat-treating temperature are selected as the values falling in the range between the curve a and the curve c of FIG. 1.

12. The method of producing a semiconductor device as defined in claim 7, wherein the partial pressure ratio of the water vapor and hydrogen, and the heat-treatment temperature, are selected such that only the semiconductor substrate surface is oxidized, without oxidizing the at least one of tungsten and molybdenum.

13. A method of producing a semiconductor device including the steps of:
 (a) forming an insulating film on a semiconductor substrate of a first conductivity type;
 (b) forming at least one of a tungsten and molybdenum film having a desired shape at a desired portion on said insulating film;
 (c) doping an impurity having a conductivity type opposite to that of said semiconductor substrate to the surface region of said semiconductor substrate using said at least one of tungsten and molybdenum film as a mask; and
 (d) carrying out heat-treatment in hydrogen gas containing water vapor so as to selectively oxidize the surface of said semiconductor substrate where said at least one of tungsten and molybdenum film is not deposited without substantially oxidizing said at least one of tungsten and molybdenum film.

14. The method of producing a semiconductor device as defined in claim 13, wherein doping of said impurity is carried out by laminating a mask film on said at least one of tungsten and molybdenum film and then effecting ion implantation.

15. The method of producing a semiconductor device as defined in claim 14, wherein said mask film consists of at least one member selected from the group consisting of a polycrystalline silicon film, a phosphosilicate glass film, an $SiO_2$ film and an $Si_3N_4$ film.

16. The method of producing a semiconductor device as defined in claim 13, wherein the partial pressure ratio between said water vapor and said hydrogen gas in said heat-treatment and the heat-treating temperature are selected as the values falling in the range between the curve b and the curve c of FIG. 1.

17. The method of producing a semiconductor device as defined in claim 16, wherein the heat-treating temperature is from about 400° C. to about 1,200° C.

18. The method of producing a semiconductor device as defined in claim 13, wherein a tungsten film is formed in step (b), and wherein the partial pressure ratio between said water vapor and said hydrogen gas in said heat-treatment and the heat-treating temperature are selected as the values falling in the range between the curve a and the curve c of FIG. 1.

19. The method of producing a semiconductor device as defined in claim 13, wherein the partial pressure ratio of the water vapor and hydrogen, and the heat-treatment temperature, are selected such that only the semiconductor substrate surface is oxidized, without oxidizing the at least one of tungsten and molybdenum.

20. The method of producing a semiconductor device as defined in claim 13, wherein said insulating film is an $SiO_2$ film.

21. The method of producing a semiconductor device as defined in claim 20, wherein said semiconductor substrate is made of silicon.

22. The method of producing a semiconductor device as defined in claim 13, wherein said forming at least one of tungsten and molybdenum film having a desired shape provides an exposed portion of said insulating film, and wherein said heat-treatment is carried out after the exposed portion of said insulating film is removed by etching.

23. The method of producing a semiconductor device as defined in claim 13, wherein said forming at least one of tungsten and molybdenum film having a desired shape provides an exposed portion of said insulating film, and wherein said heat-treatment is carried out without removing the exposed portion of said insulating film.

24. The method of producing a semiconductor device as defined in claim 13, wherein said at least one of tungsten and molybdenum film is the gate electrode of an MIS field effect semiconductor device.

25. A method of producing a semiconductor device including the steps of:
(a) forming an insulating film on a semiconductor substrate;
(b) laminating at least one of tungsten and molybdenum film on said insulating film;
(c) removing a desired portion of said at least one of tungsten and molybdenum film by etching; and
(d) carrying out heat-treatment in hydrogen gas containing water vapor to oxidize the surface of said semiconductor substrate where said at least one of tungsten and molybdenum film is not deposited, without substantially oxiding said at least one of tungsten and molybdenum film.

26. The method of producing a semiconductor device as defined in claim 25, wherein said removing a desired portion of said at least one of tungsten and molybdenum film provides an exposed portion of said insulating film, and wherein said heat-treatment is carried out after the exposed portion of said insulating film is removed by etching.

27. The method of producing a semiconductor device as defined in claim 25, wherein said removing a desired portion of said at least one of tungsten and molybdenum film provides an exposed portion of said insulating film, and wherein said heat-treatment is carried out without removing said insulating film.

28. The method of producing a semiconductor device as defined in claim 25, wherein the partial pressure ratio between said vapor and said hydrogen gas in said heat-treatment and the heat-treating temperature are selected as the values falling in the range between the curve b and the curve c of FIG. 1.

29. The method of producing a semiconductor device as defined in claim 28, wherein the heat-treating temperature is from about 400° C. to about 1,200° C.

30. The method of producing a semiconductor device as defined in claim 25, wherein tungsten is laminated in step (b), and wherein the partial pressure ratio between said water vapor and said hydrogen gas in said heat-treatment and the heat-treating temperature are selected as the values falling in the range between the curve a and the curve c of FIG. 1.

31. The method of producing a semiconductor device as defined in claim 25, wherein the partial pressure ratio of the water vapor and hydrogen, and the heat-treatment temperature, are selected such that only the semiconductor substrate surface is oxidized, without oxidizing the at least one of tungsten and molybdenum.

32. The method of producing a semiconductor device as defined in claim 25, wherein said insulating film is made of $SiO_2$.

33. The method of producing a semiconductor device as defined in claim 32, wherein said semiconductor substrate is made of silicon.

* * * * *